United States Patent
Choung et al.

(10) Patent No.: US 8,084,184 B2
(45) Date of Patent: Dec. 27, 2011

(54) COMPOSITION FOR REMOVING PHOTORESIST AND METHOD OF MANUFACTURING AN ARRAY SUBSTRATE USING THE SAME

(75) Inventors: Jong-Hyun Choung, Hwaseong-si (KR); Hong-Sick Park, Suwon-si (KR); Sun-Young Hong, Yongin-si (KR); Bong-Kyun Kim, Incheon (KR); Byeoung-Jin Lee, Yongin-si (KR); Byung-Uk Kim, Hwaseong-si (KR); Jong-Hyun Jeong, Hwaseong-si (KR); Suk-Il Yoon, Hwaseong-si (KR); Sung-Gun Shin, Hwaseong-si (KR); Soon-Beom Huh, Hwaseong-si (KR); Se-Hwan Jung, Hwaseong-si (KR); Doo-Young Jang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 450 days.

(21) Appl. No.: 12/323,649

(22) Filed: Nov. 26, 2008

(65) Prior Publication Data

US 2009/0170037 A1    Jul. 2, 2009

(30) Foreign Application Priority Data

Dec. 28, 2007    (KR) .................. 10-2007-0140687

(51) Int. Cl.
G03F 7/00 (2006.01)
G03F 7/26 (2006.01)
G03F 7/32 (2006.01)
G03F 7/40 (2006.01)

(52) U.S. Cl. ............... 430/270.1; 430/311; 430/312; 430/317; 430/318; 430/319; 430/329; 430/331

(58) Field of Classification Search ............... 430/270.1, 430/311, 312, 317, 318, 331, 322, 319, 329
See application file for complete search history.

(56) References Cited

U.S. PATENT DOCUMENTS

| | | | | |
|---|---|---|---|---|
| 6,638,694 | B2 * | 10/2003 | Ikemoto et al. | 430/331 |
| 6,744,486 | B2 * | 6/2004 | Kim et al. | 349/187 |
| 7,049,275 | B2 * | 5/2006 | Ikemoto et al. | 510/176 |
| 7,071,045 | B2 * | 7/2006 | Wu et al. | 438/197 |
| 7,125,756 | B2 * | 10/2006 | Oh et al. | 438/149 |
| 7,279,370 | B2 * | 10/2007 | Lim et al. | 438/155 |
| 7,723,280 | B2 * | 5/2010 | Brainard et al. | 510/175 |
| 7,772,174 | B2 * | 8/2010 | Satoh | 510/176 |

FOREIGN PATENT DOCUMENTS

WO    WO 2005035828 A1 *    4/2005

* cited by examiner

*Primary Examiner* — Amanda C. Walke
*(74) Attorney, Agent, or Firm* — Cantor Colburn LLP

(57) ABSTRACT

A composition for removing a photoresist includes a) an amine compound having a cyclic amine and/or a diamine, b) a glycol ether compound, c) a corrosion inhibitor and d) a polar solvent. The composition further includes a stripping promoter. Further disclosed is a method of manufacturing an array substrate using the composition for removing a photoresist.

21 Claims, 5 Drawing Sheets

FIG. 4
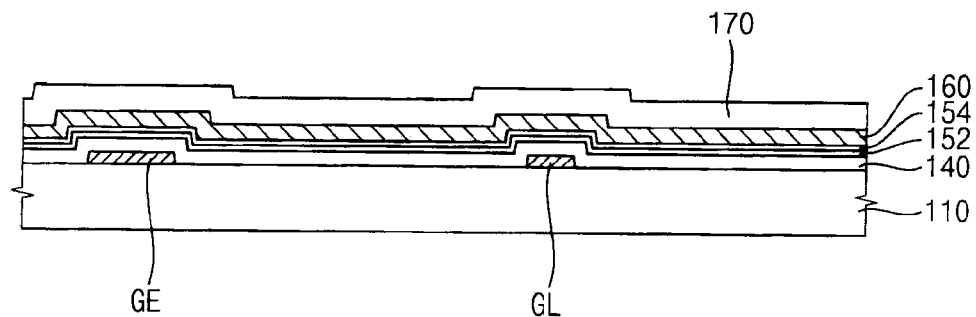
FIG. 5
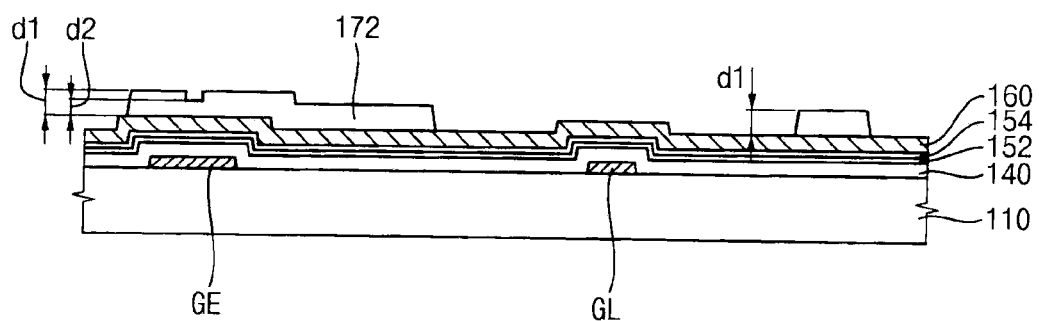

COMPOSITION FOR REMOVING PHOTORESIST AND METHOD OF MANUFACTURING AN ARRAY SUBSTRATE USING THE SAME

This application claims priority to Korean Patent Application No. 2007-140687, filed on Dec. 28, 2007, and all the benefits accruing therefrom under 35 U.S.C. §119, the contents of which in its entirety are herein incorporated by reference.

BACKGROUND OF THE INVENTION

This disclosure relates to a composition for removing a photoresist and a method of manufacturing an array substrate using the composition.

Generally, a photolithographic process includes a photo process, which includes transcribing a pattern formed in or on a mask to a substrate. The substrate may have disposed upon it a thin layer, whose function is explained below. The photolithography process may be used for manufacturing a semiconductor device, a display device such as a liquid crystal display (LCD) device, a flat panel display device, or the like, which includes an integrated circuit, a large-scale integrated circuit, or the like.

The photolithography process includes the coating of a photosensitive material on a base substrate, disposing a mask on the base substrate having the photoresist, exposing the substrate to light and developing the photoresist to form a photoresist pattern. A thin layer formed on the base substrate is etched by using the photoresist pattern as an etching mask to form a thin layer pattern. Thereafter, the photoresist pattern is removed from the base substrate by using a stripping agent.

The process for removing the photoresist pattern is generally performed at a relatively high temperature. For example, when the photoresist pattern is removed by the stripping agent at a high temperature, the stripping agent reacts with a metal of a thin layer formed under the photoresist pattern to corrode the thin layer. In order to solve the above-mentioned problem, a conventional stripping agent is used with a corrosion inhibitor.

Examples of the stripping agent include a first amine and a second amine, which include monoethanolamine, methylethanolamine, or the like. The first amine and the second amine have a relatively low boiling point so that the first amine and the second amine are easily vaporized. Thus, as time elapses, the composition of the stripping agent may be changed and the weight of the stripping agent may be reduced so that the stripping agent needs to be replaced frequently during the process for removing the photoresist pattern. Furthermore, if the stripping agent does not include a corrosion inhibitor, the first amine and the second amine of the stripping agent, even with a little water, may heavily corrode a metal thin layer.

SUMMARY OF THE INVENTION

Disclosed herein is a composition for removing a photoresist, the composition being capable of preventing and/or reducing corrosion of a metal layer and simultaneously improving the ability to remove a photoresist.

Disclosed herein too is a method of manufacturing an array substrate by using the composition for removing a photoresist.

Disclosed herein too is a composition for removing a photoresist comprising a) an amine compound having a cyclic amine and/or a diamine, b) a glycol ether compound, c) a corrosion inhibitor and d) a polar solvent. The glycol ether compound may include diethylene glycol methyl ether. The polar solvent may include a formamide compound.

Further disclosed is a method of manufacturing an array substrate. A first metal layer is formed on a base substrate. A photoresist pattern is formed on the first metal layer. The first metal layer is patterned by using the photoresist pattern as an etching mask. The photoresist pattern is removed from the base substrate by using a composition for removing a photoresist, the composition including a) an amine compound having a cyclic amine and/or a diamine, b) a glycol ether compound, c) a corrosion inhibitor and d) a polar solvent.

The composition may further comprise a stripping-promoter.

By using the above composition, corrosion of a metal layer formed under a photoresist may be prevented and/or reduced in the course of removing a photoresist. Therefore, the reliability of a manufacturing process may be improved.

Furthermore, the composition may improve the ability of removing a photoresist to thereby reduce the manufacturing time. Thus, degradation of components may be minimized so that a replacing interval for the composition may be extended. Thus, an efficiency of manufacturing a device may be improved.

BRIEF DESCRIPTION OF THE DRAWINGS

The above and other advantages of the disclosed embodiments will become readily apparent by describing in detail exemplary embodiments thereof in conjunction with the accompanying drawings, in which:

FIGS. 4, 5 and 6 are exemplary cross-sectional views illustrating a process of forming a source pattern;

DETAILED DESCRIPTION OF EXEMPLARY EMBODIMENTS

Figure 1:
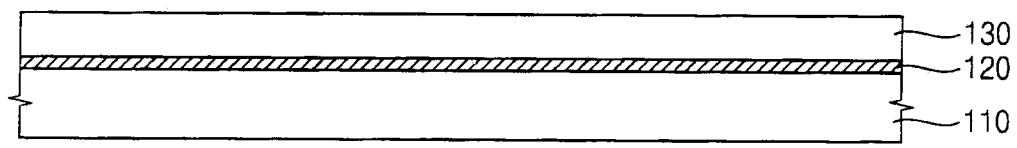
FIGS. 1 and 2 are exemplary cross-sectional views illustrating a method of forming a gate pattern.

Disclosed embodiments are described more fully hereinafter with reference to the accompanying drawings, in which exemplary embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers presenting-between. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein are interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Embodiments of the invention are described herein with reference to cross-section illustrations that are schematic illustrations of exemplary embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Composition for Removing a Photoresist

A composition for removing a photoresist according to an exemplary embodiment includes a) an amine compound having a cyclic amine and/or a diamine, b) a glycol ether compound, c) a corrosion inhibitor and d) a polar solvent. The composition for removing a photoresist may further include a stripping-promoter. Hereinafter, a composition for removing a photoresist is referred to as a "photoresist-removing composition."

Hereinafter, components of the photoresist-removing composition according to an exemplary embodiment will be more fully described.

Amine Compound

An amine compound that may be used in the photoresist-removing composition exemplary embodiment may be alkaline. The amine compound penetrates into a polymer matrix of a photoresist, and thus the photoresist is changed and cross-linked while an etching process, an ashing process, an ion implanting process, and the like are performed. Thus, the amine compound may break an intermolecular attractive force or an intramolecular attractive force of the photoresist. Accordingly, an empty space is formed in a photoresist remaining on a substrate to form a structurally weak area, and the photoresist is changed to an amorphous gel state. Thus, the photoresist may be separated from the substrate.

The amine compound that may be used may include a cyclic amine and/or a diamine, which may be represented by the following Chemical Formula 1.

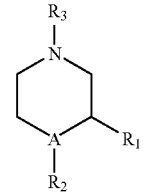

<Chemical Formula 1>

In Chemical Formula 1, A represents an oxygen atom or a nitrogen atom, and $R_1$ represents an alkyl group or an allyl group, which has 1 to about 5 carbon atoms, and $R_2$ and $R_3$ each represent an alkyl group, an allyl group, an alkyl amino group, a hydroxyl alkyl group or an alkyl benzene, which has 1 to about 5 carbon atoms. Examples of the cyclic amine may include a piperazine compound or a morpholine compound. Examples of the cyclic compound may include 1-(2-hydroxyethyl)piperazine, 1-(2-aminoethyl)piperazine, 1-(2-hydroxyethyl)-4-methylpiperazine, N-(3-aminopropyl)morpholine, 2-methylpiperazine, 1-methylpiperazine, 4-amino-1-methylpiperazine, 1-benzylpiperazine, 1-phenylpiperazine, and the like. Examples of the diamine may include 2-[(2-aminoethyl)amino]ethanol, 2-[(2-aminomethyl)amino]methanol, 1-[(2-aminoethyl)amino]-2-propanol, 2-{[2-(methylamino)ethyl]amino}ethanol, 2-[(2-amino-2-methylpropyl)amino]ethanol, amino-bis-propanolamine, and the like.

When the content of the amine compound is less than about 1% by weight, the ability of removing a photoresist is reduced. Thus, the photoresist may not be entirely removed from the base substrate, and the time for entirely removing the photoresist may be increased. When the content of the amine compound is more than about 20% by weight, the photoresist-removing composition may corrode a metal thin layer formed under the photoresist. Thus, according to an exemplary embodiment, the content of the amine compound may be about 1% to about 20% by weight, based on a total weight of the photoresist-removing composition. In another exemplary embodiment, the content of the amine compound may be about 2% to about 10% by weight, based on a total weight of the photoresist-removing composition.

Stripping-Promoter

The photoresist-removing composition may include a stripping-promoter, which promotes the stripping of a photoresist (having a gel phase) from the base substrate.

Examples of the stripping-promoter may include monomethanol amine, ethylenediamine, 2-(2-aminoethoxyl) ethanol, 1-amino-2-propanol, diethanolamine, amino-bis-propanol amine, 2-methylaminoethanol, N-methylethanolamine, triethylaminoethanol, and the like.

When the content of the stripping-promoter is less than about 1% by weight, the stripping-promoter does not effectively act to strip the photoresist. When the content of the stripping-promoter is more than about 10% by weight, the content of the amine compound is relatively reduced so that a metal thin layer under the photoresist may be easily corroded. Thus, in an exemplary embodiment, the content of the stripping-promoter may be about 1% to about 10% by weight, based on a total weight of the photoresist-removing composition. In another exemplary embodiment, the content of the stripping-promoter may be about 1% to about 5% by weight, based on a total weight of the photoresist-removing composition.

Glycol Ether Compound

The glycol ether compound is polar and aprotic. As noted above, the photoresist may be converted into a gel phase by the amine compound. The gel phase of the photoresist may be dissolved in the glycol ether compound.

Examples of the glycol ether compounds may include ethylene glycol methyl ether, ethylene glycol ethyl ether, ethylene glycol butyl ether, diethylene glycol methyl ether, diethylene glycol ethyl ether, diethylene glycol butyl ether, diethylene glycol propyl ether, triethylene glycol methyl ether, triethylene glycol ethyl ether, triethylene glycol butyl ether, or the like, or a combination comprising at least one of the foregoing glycol ether compounds.

According to an exemplary embodiment, diethylene glycol methyl ether that has a relatively low molecular weight may be used as the glycol ether compound. When diethylene glycol methyl ether is used for the glycol ether compound, the photoresist-removing composition may be easily removed by, for example, using deionized water, and the photoresist-removing composition remaining on the base substrate may be minimized. The glycol ether compound may prevent the photoresist-removing composition from vaporizing. As a result, the initial ratio of components of the composition can be maintained to be substantially constant while a removing process is performed.

When the content of the glycol ether compound is less than about 10% by weight, the content of the amine compound and/or the content of the polar solvent are relatively increased. Thus, a metal thin layer may be easily corroded, and the ability of dissolving a gel phase photoresist, (which is caused by the amine compound) may be reduced. Therefore, the ability of the photoresist-removing composition to remove a photoresist may be reduced. When the content of the glycol ether compound is more than about 90% by weight, the content of the amine compound and/or the content of the polar solvent are relatively decreased. Therefore, the ability of the photoresist-removing composition to remove a photoresist may once again be reduced. Thus, according to an exemplary embodiment, the content of the glycol ether compound may be about 10% to about 90% by weight, based on a total weight of the photoresist-removing composition. In another exemplary embodiment, the content of the glycol ether compound may be about 40% to about 70% by weight, based on a total weight of the photoresist-removing composition.

Corrosion Inhibitor

The corrosion inhibitor may include a compound containing a nitrogen atom, a sulfur atom, an oxygen atom, and the like, which have an unshared electron pair. The compound may contain a hydroxyl group, a hydrogen sulfide group, or the like. A reacting group of the corrosion inhibitor may physically and chemically adhere to a metal to thereby prevent the corrosion of a metal thin layer including the metal.

Examples of the corrosion inhibitor may include a triazole compound such as benzotriazole, tolyltriazole, mercaptobenzimidazole, mercaptomethyl benzimidazole, mercaptoethyl imidazole, hydroxypyridine, dihydroxypyridine, methyltrihydroxybenzoate, catechol, pyrogallol, L-ascorbic acid, D-isoascorbic acid, or the like, or a combination comprising at least one of the foregoing corrosion inhibitors.

When the content of the corrosion inhibitor is less than about 0.1% by weight, the metal thin layer may be corroded. When a content of the corrosion inhibitor is more than about 5% by weight, the ability of the photoresist-removing composition to remove the photoresist may be reduced. Furthermore, the corrosion inhibitor may be strongly adhered to the base substrate so that the corrosion inhibitor may remain on the base substrate. The remaining corrosion inhibitor may not be easily removed from the base substrate through a subsequent cleaning process. Thus, according to an exemplary embodiment, the content of the corrosion inhibitor may be about 0.1% to about 5% by weight, based on a total weight of the photoresist-removing composition. In another embodiment, the content of the corrosion inhibitor may be about 0.3% to about 1% by weight, based on a total weight of the photoresist-removing composition.

Polar Solvent

The polar solvent separates the photoresist that is stripped from the base substrate. The molecular unit of the polar solvent is capable of dissolving the photoresist after its removal from the substrate. Thus, the photoresist is dissolved by the polar solvent to prevent the stripped photoresist from adhering to the base substrate again. Furthermore, the polar solvent may include an amine functional group. The amine functional group may promote the amine compound to penetrate into the photoresist so as to facilitate removal of the photoresist.

Examples of the polar solvent may include N-methyl-2-pyrolidone, N-methylacetamide, N,N-dimethylacetamide, acetamide, N-ethylacetamide, N,N-diethylacetamide, formamide, N-methylformamide, N,N-dimethylformamide, N-ethylformamide, N,N-diethylformamide, N,N-dimethylimidazole, N-arylformamide, N-butylformamide, N-propylformamide, N-pentylformamide, or the like, or a combination comprising at least one of the foregoing polar solvents. In an exemplary embodiment, a formamide compound including N-methylformamide may be used as the polar solvent.

When the content of the polar solvent is less than about 5% by weight, the removing ability of the photoresist-removing composition may be reduced, and a metal thin layer may be easily corroded. When the content of the polar solvent is more than about 70% by weight, the removing ability of the photoresist-removing composition may be reduced due to relative dilution of the photoresist-removing compound. Thus, according to an exemplary embodiment, the content of the polar solvent may be about 5% to about 70% by weight, based on a total weight of the photoresist-removing composition. In another exemplary embodiment, the content of the polar solvent may be about 20% to about 50% by weight, based on a total weight of the photoresist-removing composition.

Hereinafter, a photoresist-removing composition according to an exemplary embodiment will be described more fully with reference to examples and comparative examples. However, the following examples are for illustrative purposes only and are not intended to limit the scope of the claimed invention.

Experiment 1—Evaluation on Corrosion of a Metal Layer

An aluminum layer, a molybdenum layer and a copper layer, which have a thickness of about 2,000 Å, were formed on a glass substrate, and a photoresist composition was coated on the metal layers and developed to prepare a first sample in order to evaluate a corrosion of a metal layer.

The first sample was dipped into each compound in Table 1, which was held at a temperature of about 70° C., for about 20 minutes. The results are illustrated in Table 1.

Experiment 2—Evaluation on Removing of a Photoresist

A chromium layer was formed on a glass substrate, and a photoresist composition was coated on the chromium layer and developed to form a photoresist pattern. The chromium layer was wet-etched by using an etching solution, and an etching gas was provided to the glass substrate to prepare a second sample.

The second sample was dipped into each compound in Table 1, which was held at a temperature of about 70° C., for about 30 seconds. The results are illustrated in Table 1.

Experiment 3—Evaluation on Removing of a Photoresist

An etching gas was provided to the second sample of Experiment 2 again to prepare a third sample. Deformation of the third sample due to the etching gas was greater than that of the second sample.

The third sample was dipped into each compound in Table 1, which was held at a temperature of about 70° C., for about 30 seconds. The results are illustrated in Table 1.

In Table 1, regarding Experiment 1, "⊚" represents that the sample was not corroded, "○" represents that the sample was slightly corroded, "Δ" represents that the sample was corroded substantially, and "X" represents that the sample was completely corroded. In Table 1, regarding Experiments 2 and 3, "⊚" represents that the photoresist pattern was completely removed, "○" represents that a portion of photoresist pattern remained, "Δ" represents that a great portion of photoresist pattern remained, and "X" represents that the photoresist pattern was not removed.

Referring to Table 1, it can be seen that monoethanolamine may remove a photoresist pattern, but may heavily corrode the metal layer. Furthermore, it can be seen that 1-(2-hydroxyethyl)piperazine, 1-(2-aminoethyl)piperazine, 1-(2-hydroxyethyl)-4-methylpiperazine, N-(3-aminopropyl)morpholine, 2-methylpiperazine, 1-methylpiperazine, 1-amino-1-methylpiperazine, 2-[(2-aminoethyl)amino]ethanol and 1-[(2-aminoethyl)amino]-2-propanol may remove a photoresist pattern while preventing and/or reducing corrosion of a metal layer, compared to monoethanolamine.

Furthermore, it can be seen that N-methyl-2-pyrolidone, N,N-dimethylacetamide, diethylene glycol butyl ether and diethylene glycol ethyl ether may have less ability to remove a photoresist pattern, but may hardly corrode a metal layer.

A compound such as diethylene glycol butyl ether and diethylene glycol ethyl ether, which was able to remove the photoresist pattern in Experiment 2, was not able to remove the photoresist pattern in Experiment 3. Thus, removing a photoresist pattern may depend on deformation of the photoresist pattern. When the photoresist pattern was highly deformed, 1-(2-hydroxyethyl)piperazine, 1-(2-aminoethyl)piperazine, 1-(2-hydroxyethyl)-4-methylpiperazine, N-(3-aminopropyl)morpholine, 2-methylpiperazine, 1-methylpiperazine, 1-amino-1-methylpiperazine, 2-[(2-aminoethyl)amino]ethanol and 1-[(2-aminoethyl)amino]-2-propanol have been found out to have less ability of removing a photoresist pattern, compared to monoethanolamine. Thus, it can be seen that a compound having at least two nitrogen atoms may reduce corrosion of a metal layer, but may have less ability to remove the photoresist pattern. Therefore, a chain-type amine compound such as monoethanolamine may be used with the compound having at least two nitrogen atoms to prepare a photoresist-removing composition, which is capable of preventing corrosion of a metal and also of improving the ability to remove a photoresist.

Experiment 4—Evaluation on Corrosion of a Metal Layer

The first sample was dipped into a composition including each compound in Table 2, which was held at a temperature of about 70° C., for about 20 minutes. The results are illustrated in Table 2. A different amine compound was used, along with the amine compound having less ability to remove the photoresist as seen in Experiments 1 to 3. The metal layer was slightly corroded in Experiments 1 to 3. Thus, the composi

TABLE 1

| | Experiment 1 | | | | |
|---|---|---|---|---|---|
| | Aluminum | Molybdenum | Copper | Experiment 2 | Experiment 3 |
| Monoethanolamine | X | X | X | ⊚ | ⊚ |
| 1-(2-hydroxyethyl)piperazine | ○ | ○ | ○ | ○ | Δ |
| 1-(2-aminoethyl)piperazine | ○ | ○ | X | ⊚ | ○ |
| 1-(2-hydroxyethyl)-4-methylpiperazine | ⊚ | ⊚ | ⊚ | ○ | Δ |
| N-(3-aminopropyl)morpholine | Δ | Δ | X | ⊚ | ○ |
| 2-methylpiperazine | ○ | ○ | Δ | Δ | Δ |
| 1-methylpiperazine | ○ | ○ | ○ | Δ | Δ |
| 1-amino-1-methylpiperazine | ○ | ○ | ○ | ⊚ | ○ |
| 2-[(2-aminoethyl)amino]ethanol | Δ | ○ | X | ⊚ | ⊚ |
| 1-[(2-aminoethyl)amino]-2-propanol | Δ | ○ | X | ⊚ | ⊚ |
| N-methyl-2-pyrolidone | ⊚ | ⊚ | ⊚ | ○ | Δ |
| N,N-dimethylacetamide | ⊚ | ⊚ | ⊚ | ○ | Δ |
| Diethylene glycol butyl ether | ⊚ | ○ | ⊚ | Δ | X |
| Diethylene glycol ethyl ether | ⊚ | ○ | ⊚ | Δ | X | tion of Experiment 4 further included about 10% by weight of an amine compound of Table 2, about 45% by weight of glycol ether and about 45% by weight of diethylene glycol butyl ether as a polar solvent.

In Table 2, "⊚" represents that the sample was not corroded, "○" represents that the sample was slightly corroded, "Δ" represents that the sample was corroded much, and "X" represents that the sample was completely corroded.

TABLE 2

|  | Experiment 4 | | |
| --- | --- | --- | --- |
|  | Aluminum | Molybdenum | Copper |
| Monoethanolamine | ○ | ○ | X |
| 1-(2-hydroxyethyl)piperazine | ⊚ | ⊚ | ⊚ |
| 1-(2-aminoethyl)piperazine | ○ | ○ | X |
| N-(3-aminopropyl)morpholine | ○ | ○ | X |
| 1-(2-hydroxyethyl)-4-methylpiperazine | ⊚ | ⊚ | ⊚ |
| 2-[(2-aminoethyl)amino]ethanol | ○ | ⊚ | ○ |
| 1-[(2-aminoethyl)amino]-2-propanol | ○ | ○ | ○ |
| 1-amino-4-methylpiperazine | ⊚ | ○ | ⊚ |
| 2-[(2-aminoethyl)amino]ethanol and 1-(2-hydroxyethyl)piperazine | ⊚ | ⊚ | ○ |
| Monoethanolamine and 1-(2-hydroxyethyl)piperazine | ⊚ | ⊚ | Δ |

Referring to Table 2, it can be seen that 1-(2-hydroxyethyl)piperazine, 1-(2-aminoethyl)piperazine, N-(3-aminopropyl)morpholine, 1-(2-hydroxyethyl)-4-methylpiperazine, 2-[(2-aminoethyl)amino]ethanol, 1-[(2-aminoethyl)amino]-2-propanol, 1-amino-4-methylpiperazine, a mixture of 2-[(2-aminoethyl)amino]ethanol and 1-(2-hydroxyethyl)piperazine and a mixture of monoethanolamine and 1-(2-hydroxyethyl)piperazine may prevent and/or reduce corrosion of a metal layer, compared with just monoethanolamine. In addition, it can be seen that 1-(2-hydroxyethyl)-4-methylpiperazine and 1-amino-4-methylpiperazine, in which functional groups were substituted for all hydrogen atoms coupled to a nitrogen atom, may prevent and/or reduce corrosion of the metal layer. Furthermore, it can be seen that a composition including the mixture of monoethanolamine and 1-(2-hydroxyethyl)piperazine may prevent and/or reduce corrosion of the metal layer more effectively than a composition including only monoethanolamine as an amine compound.

EXAMPLES 1 to 10

Composition for Removing a Photoresist

Compositions for removing a photoresist were prepared according to Table 3.

TABLE 3

| Example | Amine compound | | Glycol ether | | Polar solvent | | Stripping-promoter | | Corrosion inhibitor | |
| --- | --- | --- | --- | --- | --- | --- | --- | --- | --- | --- |
|  | compound | C | compound | C | compound | C | compound | C | compound | C |
| 1 | APM | 5 | DEGBE | 64.5 | NMP | 30 | — | — | BT | 0.5 |
| 2 | APM | 5 | DEGME | 64.5 | MMF | 30 | — | — | BT | 0.5 |
| 3 | AEAP | 5 | DEGBE | 64.5 | NMP | 30 | — | — | BT | 0.5 |
| 4 | AEAP | 5 | DEGME | 64.5 | MMF | 30 | — | — | BT | 0.5 |
| 5 | HEP | 5 | DEGME | 64.5 | MMF | 30 | MEA | 2 | BT | 0.5 |
| 6 | HEP | 5 | DEGME | 64.5 | MMF DMAc | 15 15 | MIPA | 2 | BT | 0.5 |
| 7 | HEP | 5 | DEGME | 64.5 | MMF | 30 | — | — | BT | 0.5 |
| 8 | HEP | 5 | DEGME | 64.5 | MMF DMAc | 15 15 | AEAE | 2 | BT | 0.5 |
| 9 | HEP | 5 | DEGME | 64.5 | MMF NMP | 15 15 | AEAE | 2 | BT | 0.5 |
| 10 | HEP | 5 | DEGME | 64.5 | MMF | 30 | AEE | 2 | BT | 0.5 |

In Table 3, the column C represents a content of a component (% by weight). Furthermore, APM represents N-(3-aminopropyl)morpholine, AEAP represents 1-[(2-aminoethyl)amino]-2-propanol, HEP represents 1-(2-hydroxyethyl)piperazine, DEGBE represents diethylene glycol butyl ether, DEGME represents diethylene glycol methyl ether, NMP represents N-methyl-2-pyrolidone, MMF represents N-methylformamide, DMAc represents dimethylacetamide, MEA represents monomethanol amine, MIPA represents monoisopropylamine, AEAE represents 2-[(2-aminoethyl)amino]ethanol, AEE represents aminoethoxyethanol and BT represents benzotriazole.

COMPARATIVE EXAMPLES 1 AND 2

Comparative examples 1 and 2 were prepared according to the following Table 4.

TABLE 4

| | Amine compound | | Glycol ether | | Polar solvent | |
| --- | --- | --- | --- | --- | --- | --- |
| | compound | content | compound | Content | compound | content |
| Comparative Example 1 | APM | 5 | DEGBE | 64.5 | NMP | 30 |
| Comparative Example 2 | HEP | 5 | DEGBE | 64.5 | NMP | 30 |

In Table 4, the content is % by weight. Furthermore, APM represents N-(3-aminopropyl)morpholine, HEP represents 1-(2-hydroxyethyl)piperazine, DEGBE represents diethylene glycol butyl ether, and NMP represents N-methyl-2-pyrolidone.

Experiment 5—Evaluation on Removing of a Photoresist

Results obtained by evaluating the ability to remove a photoresist, for each of compositions of Examples 1 to 10 and Comparative Examples 1 and 2, are illustrated in Table 5. The third sample of Experiment 3 was dipped in each of the compositions of the Examples 1 to 10 and the Comparative Examples 1 and 2 at a temperature of about 70° C., and results obtained by observing through the naked eye are illustrated in the following Table 5.

Experiment 6—Evaluation on Removing of a Photoresist

Each compositions of Examples 1 to 10 and Comparative Examples 1 and 2 was maintained in an enforced exhaustion state at a temperature of about 70° C. for about 48 hours. Thereafter, the third sample of Experiment 3 was dipped in each of the compositions. The results are illustrated in Table 5.

In Table 5, "⊚" represents that the photoresist pattern was completely removed, "○" represents that a portion of photoresist pattern remained, and "Δ" represents that a relatively large portion of photoresist pattern remained.

TABLE 5

|  | Experiment 5 | Experiment 6 |
| --- | --- | --- |
| Example 1 | ⊚ | ⊚ |
| Example 2 | ⊚ | ⊚ |
| Example 3 | ⊚ | ⊚ |
| Example 4 | ⊚ | ⊚ |
| Example 5 | ⊚ | ⊚ |
| Example 6 | ⊚ | ⊚ |
| Example 7 | ⊚ | ⊚ |
| Example 8 | ⊚ | ⊚ |
| Example 9 | ⊚ | ⊚ |
| Example 10 | ⊚ | ⊚ |
| Comparative Example 1 | Δ | Δ |
| Comparative Example 2 | Δ | Δ |

Referring to Table 5, it can be seen that, with respect to the third sample, a stripping ability of the composition of Comparative Example 1, which has a relatively low boiling point, is low, as compared with the compositions of Examples 1 to 10. The compositions of Examples 1 to 10 completely removed the photoresist pattern at a temperature of about 70° C. Thus, it can be seen that the compositions of Examples 1 to 10 have a high stripping ability. Referring to results of Experiment 6, the compositions of Examples 1 to 10 completely removed the photoresist pattern like the results of Experiment 5 after a time lapse of about 48 hours at a temperature of about 70° C. Thus, it can be seen that the compositions of Examples 1 to 10 may be stored for a long period of time without losing their ability to remove a photoresist.

Experiment 7—Evaluation on Corrosion of a Metal Layer

Each of compositions of Examples 1 to 10 and Comparative Examples 1 and 2 was mixed with water such that the content of the water was about 3% by weight based on a total weight of the mixture. The first sample was dipped in the mixture of water and each of the compositions of Examples 1 to 10 or they were dipped in a mixture of water and the composition of the Comparative Examples 1 or 2 for about 600 seconds. The obtained results are illustrated in Table 6.

In Table 6, "⊚" represents that the sample was not corroded, "○" represents that the sample was slightly corroded, "Δ" represents that the sample was corroded much, and "X" represents that the sample was completely corroded.

TABLE 6

|  | Aluminum | Molybdenum | Copper |
| --- | --- | --- | --- |
| Example 1 | ⊚ | ⊚ | ⊚ |
| Example 2 | ⊚ | ⊚ | ⊚ |
| Example 3 | ⊚ | ⊚ | ⊚ |
| Example 4 | ⊚ | ⊚ | ⊚ |
| Example 5 | ⊚ | ⊚ | ○ |
| Example 6 | ⊚ | ⊚ | ⊚ |
| Example 7 | ⊚ | ⊚ | ⊚ |
| Example 8 | ⊚ | ⊚ | ⊚ |
| Example 9 | ⊚ | ⊚ | ⊚ |
| Example 10 | ⊚ | ⊚ | ⊚ |
| Comparative Example 1 | X | ○ | X |
| Comparative Example 2 | Δ | ⊚ | Δ |

Referring to Table 6, it can be seen that the mixture of water and the composition of Comparative Example 1 completely corroded an aluminum layer and a copper layer of the first sample, and slightly corroded a molybdenum layer of the first sample. In contrast, it can be seen that the mixture of water and the composition of Examples 1 to 10 hardly corroded an aluminum layer, a molybdenum layer and a copper layer when immersed for the first sample.

Furthermore, it can be seen that the mixture of water and the composition of Comparative Example 2 hardly corroded a molybdenum layer of the first sample, but corroded an aluminum layer and a copper layer of the first sample. Thus, it can be seen that the composition of Comparative Example 2 easily corrodes the metal layers, compared to the composition of Example 7.

Therefore, the amine compound may improve the ability of stripping a photoresist while preventing and/or reduce corrosion of a metal layer when used with a corrosion inhibitor, diethyleneglycol methyl ether as a glycol ether compound and N-methylformamide as a polar solvent.

As described above, a photoresist-removing composition, which includes an amine compound having a cyclic amine and/or a diamine, a glycol ether compound, a corrosion inhibitor and a polar solvent, may improve the ability to remove a photoresist while preventing and/or reducing corrosion of the metal layer.

Method of Manufacturing an Array Substrate

Figure 2:
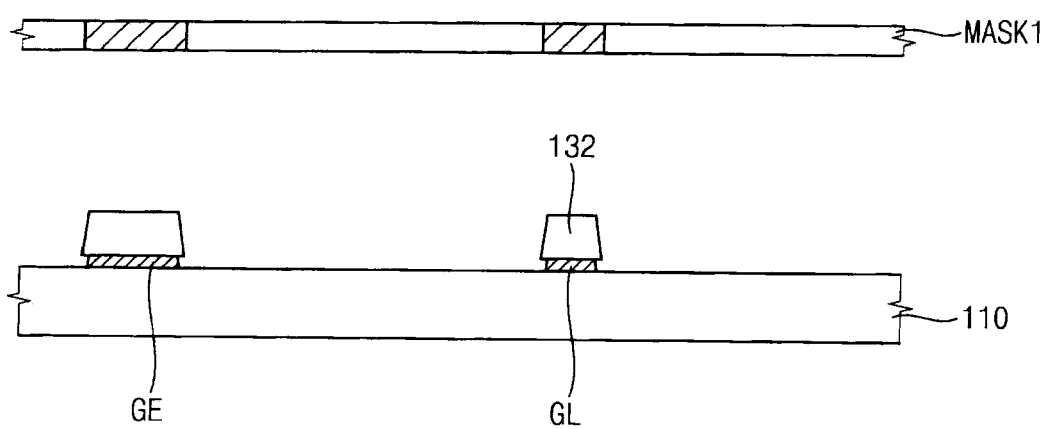

FIGS. 1 and 2 are exemplary cross-sectional views illustrating a method of forming a gate pattern according to one exemplary embodiment.

Referring to FIG. 1, a gate metal layer 120 is formed on a base substrate 110, and a first photoresist film 130 is formed on the gate metal layer 120. Examples of a material that may be used for the gate metal layer 120 may include copper, molybdenum, aluminum, or the like.

The first photoresist film 130 may be coated by dropping a photoresist composition on the gate metal layer 120 formed on the base substrate 110. Examples of a method for coating the photoresist composition may include a slit-coating method, a spin-coating method, spray painting, electrostatic spray painting, or the like.

The photoresist composition may be a positive photoresist composition forming a photoresist film, so that a portion exposed to light is removed by a developing solution, and an unexposed portion remains.

Referring to the FIG. 1 and FIG. 2, a first mask MASK1 is disposed on the first photoresist film 130 formed on the base substrate 110, and a light is irradiated through the first mask MASK1. The first photoresist film 130 is patterned through a photolithography process. The patterned first photoresist film 130 forms a first photoresist pattern 132.

The gate metal layer 120 is etched by using the first photoresist pattern 132 as an etching mask to form a gate pattern. The gate pattern may include a gate line GL extending in a predetermined direction on the base substrate 110 and a gate electrode GE extended from the gate line GL.

Figure 3:
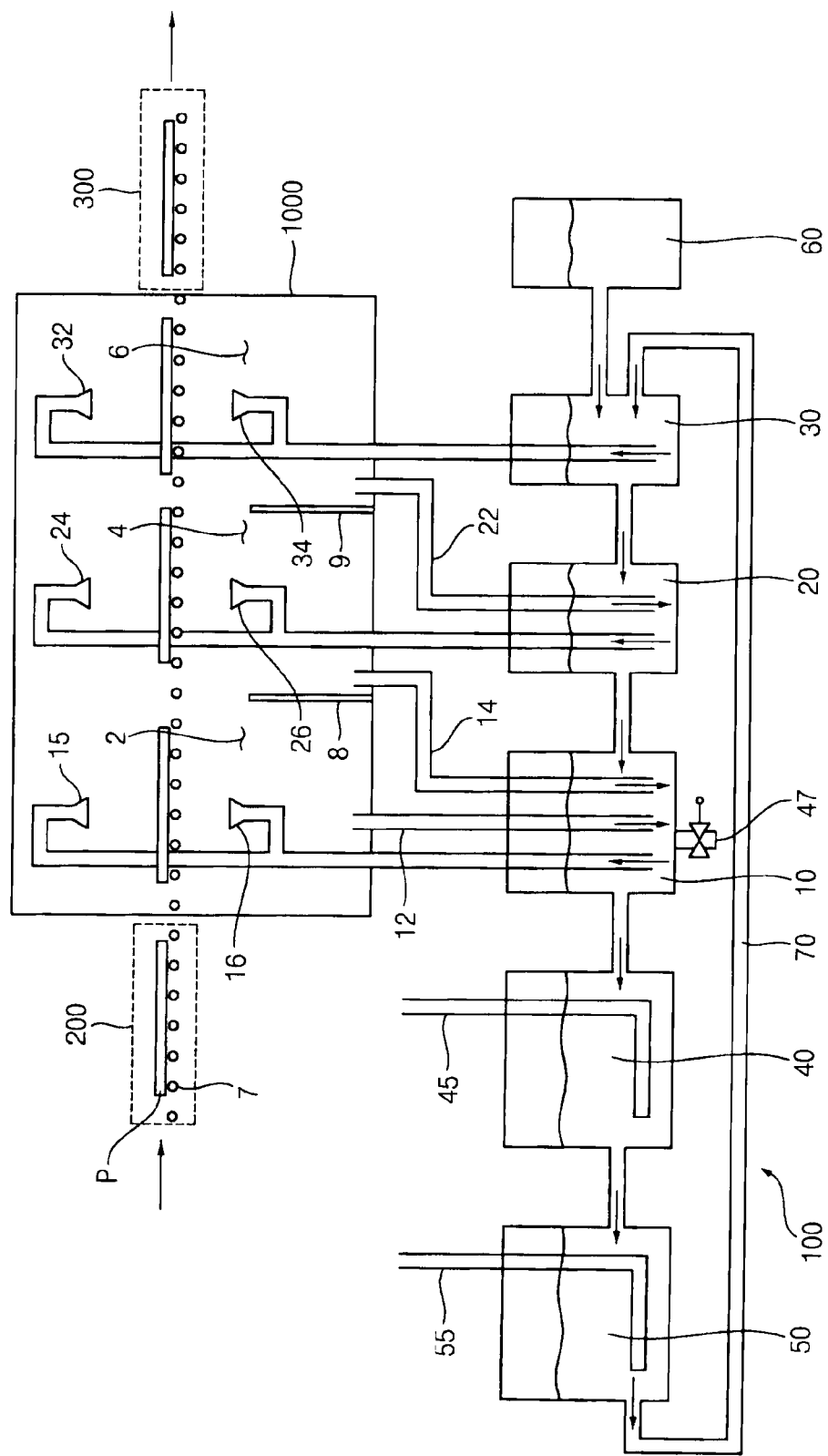
FIG. 3 is an exemplary schematic cross-sectional view illustrating an apparatus for removing a photoresist.

FIG. 3 is a schematic cross-sectional view illustrating an apparatus for removing a photoresist.

Referring to FIG. 1 and FIG. 3, the base substrate 110 is moved into an apparatus 100 for removing a photoresist in order to remove the first photoresist pattern 132 formed on the gate pattern. The apparatus 100 may include a chamber 1000, a conveyor 7, a first tank 10, a second tank 20, a third tank 30, an ozone reactor 40, a gas remover 50 and an unused-solution tank 60. The base substrate 110 having the first photoresist pattern 132 is moved into the chamber 1000 by the conveyor 7. Hereinafter, the base substrate 110 having the first photoresist pattern 132 will be referred as a "substrate," and denoted by "P" in the figures.

The chamber 1000 is divided by a first wall 8 and a second wall 9 to form a plurality of baths, for example, a first bath 2, a second bath 4 and a third bath 6. The chamber 1000 may include a first nozzle 15, a second nozzle 16, a third nozzle 24, a fourth nozzle 26, a fifth nozzle 32 and a sixth nozzle 34 to spray the photoresist-removing composition. The photoresist-removing composition includes a) an amine compound having a cyclic amine and/or a diamine, b) a glycol ether compound, c) a corrosion inhibitor and d) a polar solvent. The photoresist-removing composition may further include a stripping promoter. The photoresist-removing composition is substantially the same as the previously explained photoresist-removing composition, which includes the compositions of Examples 1 to 10. Thus, any further explanation will be omitted.

The substrate P passes through the chamber 1000 from a loading portion 200, on which the substrate is initially disposed, and may be continuously moved to an unloading portion 300. The substrate P may continuously pass through the baths, or may move stepwise after staying in each bath for a time period. The photoresist-removing composition being sprayed towards the substrate P may drop toward the bottom of the baths by gravity.

A portion of the photoresist-removing composition in the first tank 10 is sprayed onto the substrate P through the first and second nozzles 15 and 16 of the first bath 2, and the remaining portion of the photoresist-removing composition in the first tank 10 is moved into the ozone reactor 40. When the content of a residual photoresist in the photoresist-removing composition is higher than a predetermined reference value, the first tank 10 does not provide the photoresist-removing composition to the ozone reactor 40, but exhausts the photoresist-removing composition through an outlet 47.

The ozone reactor 40 removes the residual photoresist from the photoresist-removing composition so that the photoresist-removing composition is reusable. The first photoresist pattern is formed from an organic film. The first photoresist pattern is removed by the photoresist-removing composition. Thus, at least a portion of the photoresist pattern is dissolved in the photoresist-removing composition. Even if the photoresist-removing composition includes a residual photoresist, the photoresist-removing composition may again serve to remove a photoresist pattern. However, the substrate P may be contaminated by the residual photoresist so that the efficiency of removing additional photoresist patterns is reduced. Ozone is an oxidant stronger than hydrogen peroxide, and does not form a new reactant in the photoresist-removing composition. When the ozone gas is provided to the photoresist-removing composition that includes remnants of the photoresist, the residual photoresist that is dissolved or dispersed in the photoresist-removing composition is decomposed to generate an organic acid, carbon dioxide, water, etc.

The gas remover 50 serves to remove ozone remaining in the photoresist-removing composition after ozone is provided to the photoresist-removing composition. The gas remover 50 has a space receiving the photoresist-removing composition, to which ozone is applied in the ozone reactor 40. Furthermore, the gas remover 50 includes a nitrogen inlet 55 for providing a nitrogen gas. When a nitrogen gas is applied to the photoresist-removing composition, which includes ozone, the ozone is decomposed to generate an oxygen gas and water.

The photoresist-removing composition, which becomes reusable, is provided to the third tank 30 through a recovery line 70. The photoresist-removing composition is mixed with an unused photoresist-removing composition, which is provided from the unused-solution tank 60, to be sprayed onto the substrate P in the third bath 6.

Accordingly, the first photoresist pattern 132 is removed in the apparatus 100 for removing a photoresist so that only the gate pattern substantially remains on the base substrate 110. The base substrate 110 may be rinsed through performing a process to remove the photoresist-removing composition, which remains on the base substrate 110.

The photoresist-removing composition according to an exemplary embodiment can easily remove the first photoresist pattern 132 in the apparatus 100 for removing a photoresist, and may minimize corrosion of the gate pattern.

Figure 6:
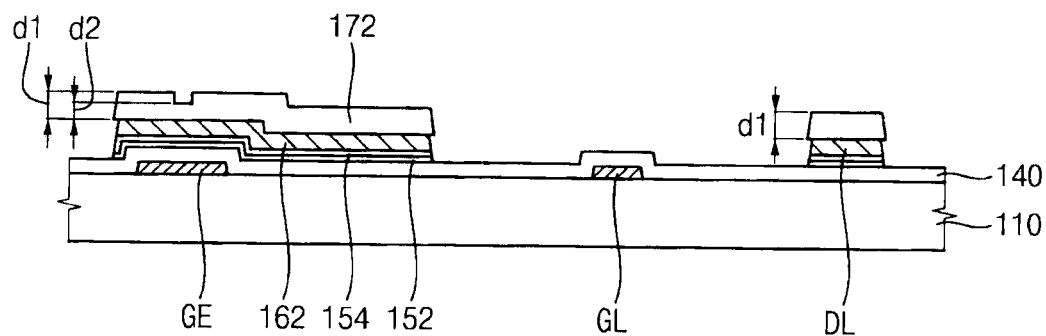

FIGS. 4, 5 and 6 are cross-sectional views illustrating a process of forming a source pattern according to an exemplary embodiment.

Referring to FIG. 4, a gate insulation layer 140, a semiconductor layer 152, an ohmic contact layer 154 and a source metal layer 160 are sequentially formed on the base substrate 110 having the gate metal. A second photoresist film 170 is formed on the source metal layer 160. Examples of a material that may be used for the source metal layer 160 may include copper, molybdenum, aluminum, or the like. The second photoresist film 170 may be formed from a positive photoresist composition.

Referring to FIG. 5, a second mask MASK2 is disposed beyond the base substrate 110 having the second photoresist film 170, and a light is irradiated toward the base substrate 110 to form a second photoresist pattern 172. The second mask MASK2 includes a transparent portion 82, a light-blocking portion 84 and a half-transparent portion 86.

A portion of the second photoresist film 170, which corresponds to the transparent portion 82, is removed by a developing solution. A portion of the second photoresist film 170, which corresponds to the light-blocking portion 84, forms a first portion d1 of the second photoresist pattern 172, which has a thickness substantially the same as the thickness of the photoresist film 170 before being developed. A portion of the second photoresist film 170, which corresponds to the half-transparent portion 86, forms a second portion d2 of the second photoresist pattern 172, which has a thickness thinner that the thickness of the first portion d1. Accordingly, the second photoresist pattern 172 having the first portion d1 and the second portion d2 is formed on the source metal layer 160.

Referring to FIG. 6, the source metal layer 160 is etched by using the second photoresist pattern 172 as an etching mask to form a data line DL and a switching pattern 162 connected to the data line DL. The data line DL crosses the gate line GL. For example, the source metal layer 160 may be etched by a wet-etching process using an etching solution. Thereafter, the ohmic contact layer 154 and the semiconductor layer 152 are etched by using the second photoresist pattern 172 and the switching pattern 162 as an etching mask.

Thereafter, an ashing process is performed to remove the second portion d2 of the second photoresist pattern 172 and to form a remaining photoresist pattern (not shown) from the first portion d1, the thickness of which is reduced.

Figure 7:
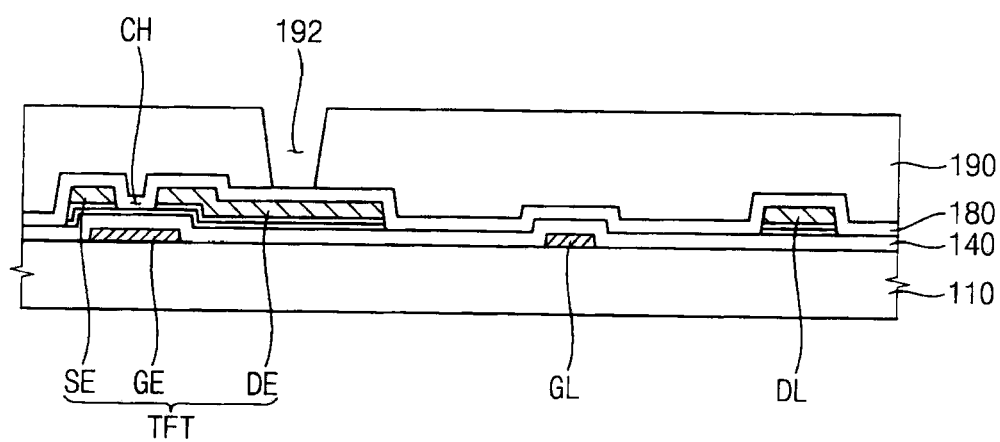
FIG. 7 is an exemplary cross-sectional view illustrating a process of forming a passivation layer.

FIG. 7 is a cross-sectional view illustrating a process of forming a passivation layer according to an exemplary embodiment.

Referring to FIG. 7, a portion of the switching pattern 162, which is exposed through an area corresponding to the second portion d2, is removed by using the remaining photoresist pattern as an etching mask to form a source electrode SE connected to the data line DL and a drain electrode DE spaced apart from the source electrode SE. Accordingly, a source pattern including the source electrode SE, the drain electrode DE and the data line DL are formed.

Thereafter, a portion of the ohmic contact layer 154, which is exposed between the source electrode SE and the drain electrode DE, is removed by using the source electrode SE, the drain electrode DE and the remaining photoresist pattern as an etching mask. Accordingly, a channel portion CH of a switching device TFT is formed.

The remaining photoresist pattern on the base substrate 110 having the channel portion CH may be removed, for example, by using the apparatus 100 for removing a photoresist as illustrated in FIG. 3. The remaining photoresist pattern may be removed by using the photoresist-removing composition, which is used for removing the first photoresist pattern. Processes for removing the remaining photoresist pattern may be substantially the same as the processes for removing the first photoresist pattern. Thus, any further explanation will be omitted.

When the remaining photoresist pattern is removed by the photoresist-removing composition according to an exemplary embodiment, the remaining photoresist pattern may be easily removed, and corrosion of the source pattern may be prevented and/or reduced.

Referring to FIG. 7, a passivation layer 180 is formed on the base substrate 110 having the source pattern. A positive photoresist composition is coated on the passivation layer 180 to form a third photoresist film 190 having a hole 192. The hole 192 exposes a portion of the passivation layer 180, which is formed on the drain electrode DE.

Figure 8:
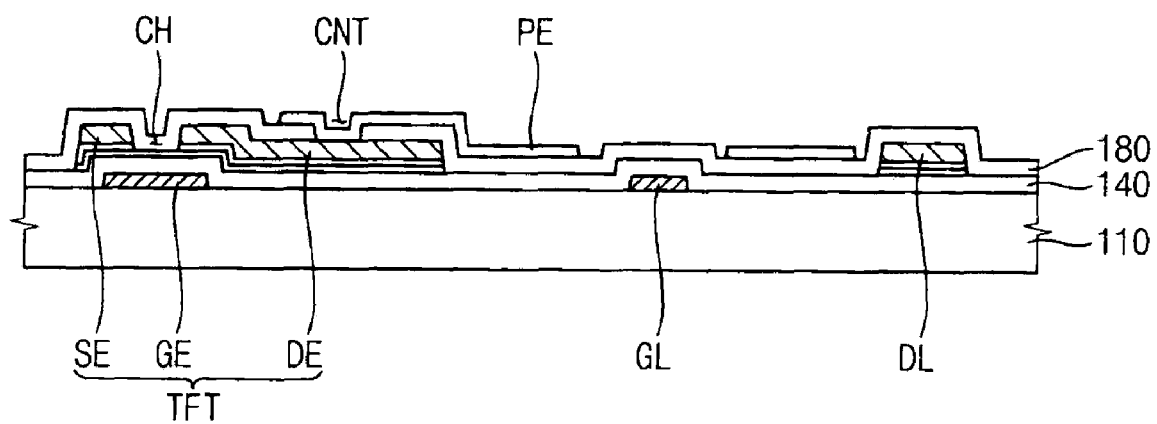
FIG. 8 is an exemplary cross-sectional view illustrating a process of forming a pixel electrode.

FIG. 8 is a cross-sectional view illustrating a process of forming a pixel electrode according to an exemplary embodiment.

Referring to FIG. 8, the passivation layer 180 is etched by using the third photoresist film 190 as an etching mask to form a contact hole CNT. An end portion of the drain electrode DE is exposed through the contact hole CNT. The third photoresist film 190 may be removed in the apparatus 100 for removing a photoresist by using the photoresist-removing composition according to an exemplary embodiment.

A transparent electrode layer (not shown) is formed on the passivation layer 180 having the contact hole CNT. A fourth photoresist film is formed on the transparent electrode layer, and then patterned. The transparent electrode layer is patterned by using the patterned fourth photoresist film as an etching mask to form a pixel electrode PE electrically connected to the drain electrode DE. The fourth photoresist film may be removed in the apparatus 100 for removing a photoresist by using the photoresist-removing composition as detailed above. Although the exemplary embodiments have been described, it is understood that the present invention should not be limited to these exemplary embodiments, but various changes and modifications can be made by one ordinary skilled in the art within the spirit and scope of the present invention as hereinafter claimed.

In addition, many modifications can be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguished one element from another. Furthermore, the use of the terms a, an, etc. do not denote a limitation of quantity, but rather denote the presence of at least one of the referenced item.

What is claimed is:

1. A composition for removing a photoresist, the composition consisting essentially of:
   a) about 1 to about 20% by weight of an amine compound including a cyclic amine and/or a diamine selected from the group consisting of 1-(2-hydroxyethyl)piperazine, 1-(2-aminoethyl)piperazine, 1-(2-hydroxyethyl)-4-methylpiperazine, N-(3-aminopropyl)morpholine, 2-methylpiperazine, 1-methylpiperazine, 4-amino-1-methylpiperazine, 1-benzylpiperazine, 1-phenylpiperazine, 2-[(2-aminoethyl)amino]ethanol, 1-[(2-aminoethyl)amino]-2-propanol, 2-{[2-(methylamino)ethyl]amino}ethanol, 2-[(2-amino-2-methylpropyl)amino]ethanol and amino-bis-propanolamine;
   b) about 10 to about 90% by weight of a glycol ether compound;
   c) about 0.1 to about 5% by weight of a corrosion inhibitor; and
   d) about 5 to about 70% by weight of a polar solvent.

2. The composition of claim 1, wherein the glycol ether compound is selected from the group consisting of ethylene glycol methyl ether, ethylene glycol ethyl ether, ethylene glycol butyl ether, diethylene glycol methyl ether, diethylene glycol ethyl ether, diethylene glycol butyl ether, diethylene glycol propyl ether, triethylene glycol methyl ether, triethylene glycol ethyl ether and triethylene glycol butyl ether.

3. The composition of claim 1, wherein the content of the glycol ether compound is about 40% to about 70% by weight, based on a total weight of the composition.

4. The composition of claim 1, wherein the glycol ether compound comprises diethylene glycol methyl ether.

5. The composition of claim 1, wherein the polar solvent is selected from the group consisting of N-methyl-2-pyrolidone, N-methylacetamide, N,N-dimethylacetamide, acetamide, N-ethylacetamide, N,N-diethylacetamide, formamide, N-methylformamide, N,N-dimethylformamide, N-ethylformamide, N,N-diethylformamide, N,N-dimethylimidazole, N-arylformamide, N-butylformamide, N-propylformamide and N-pentylformamide.

6. The composition of claim 1, wherein the polar solvent comprises a formamide compound.

7. The composition of claim 6, wherein the polar solvent comprises N-methylformamide.

8. The composition of claim 1, wherein the content of the polar solvent is about 20% to about 50% based, on a total weight of the composition.

9. The composition of claim 1, wherein the content of the amine compound is about 2% to about 10% by weight, based on a total weight of the photoresist-removing composition.

10. The composition of claim 1, further comprising a stripping-promoter.

11. The composition of claim 10, wherein the stripping-promoter is selected from the group consisting of ethylenediamine, 2-(2-aminoethoxyl)ethanol, 1-amino-2-propanol, diethanol amine, amino-bis-propanol amine, 2-methylamino ethanol, N-methylethanol amine and triethylamino ethanol.

12. The composition of claim 10, wherein a content of the stripping-promoter is about 1% to about 10% by weight, based on a total weight of the photoresist-removing composition.

13. The composition of claim 12, wherein the content of the stripping-promoter is about 1 to about 5% by weight, based on a total weight of the composition.

14. The composition of claim 1, wherein the corrosion inhibitor is selected from the group consisting of benzotriazole, tolyltriazole, mercaptobenzimidazole, mercaptomethyl benzimidazole, mercaptomethyl imidazole, hydroxypyridine, dihydroxypyridine, methyltrihydroxybenzoate, catechol, pyrogallol, L-ascorbic acid and D-isoascorbic acid.

15. The composition of claim 1, wherein the content of the corrosion inhibitor is about 0.3% to about 1% by weight, based on a total weight of the composition.

16. A method of manufacturing an array substrate, the method comprising:
forming a first metal layer on a base substrate;
forming a first photoresist pattern on the first metal layer;
patterning the first metal layer by using the first photoresist pattern as an etching mask to form a first metal line and a first electrode;
removing the first photoresist pattern from the base substrate by using a composition for removing a photoresist, which consists essentially of:
a) about 1 to about 20% by weight of an amine compound having a cyclic amine and/or a diamine selected from the group consisting of 1-(2-hydroxyethyl)piperazine, 1-(2-aminoethyl)piperazine, 1-(2-hydroxyethyl)-4-methylpiperazine, N-(3-aminopropyl)morpholine, 2-methylpiperazine, 1-methylpiperazine, 4-amino-1-methylpiperazine, 1-benzylpiperazine, 1-phenylpiperazine, 2-[(2-aminoethyl)amino]ethanol, 1-[(2-aminoethyl)amino]-2-propanol, 2-{[2-(methylamino)ethyl]amino}ethanol, 2-[(2-amino-2-methylpropyl)amino]ethanol and amino-bis-propanolamine,
b) about 10 to about 90% by weight of a glycol ether compound,
c) about 0.1 to about 5% by weight of a corrosion inhibitor, and
d) about 5 to about 70% by weight of a polar solvent.

17. The method of claim 16, further comprising:
forming a second metal layer formed on the first metal line and the first electrode;
patterning the second metal layer by using the second photoresist pattern as an etching mask to form a second metal line crossing the first metal line and a second electrode;
removing the second photoresist pattern by using the composition for removing a photoresist; and
forming a pixel electrode on the base substrate having the second metal line and the second electrode.

18. The method of claim 16, wherein the glycol ether compound is selected from the group consisting of ethylene glycol methyl ether, ethylene glycol ethyl ether, ethylene glycol butyl ether, diethylene glycol methyl ether, diethylene glycol ethyl ether, diethylene glycol butyl ether, diethylene glycol propyl ether, triethylene glycol methyl ether, triethylene glycol ethyl ether and triethylene glycol butyl ether.

19. The method of claim 16, wherein the polar solvent is selected from the group consisting of N-methyl-2-pyrolidone, N-methylacetamide, N,N-dimethylacetamide, acetamide, N-ethylacetamide, N,N-diethylacetamide, formamide, N-methylformamide, N,N-dimethylformamide, N-ethylformamide, N,N-diethylformamide, N,N-dimethylimidazole, N-arylformamide, N-butylformamide, N-propylformamide and N-pentylformamide.

20. The method of claim 16, wherein the composition for removing a photoresist further comprises a stripping promoter.

21. The method of claim 20, wherein the stripping promoter comprises at least one selected from the group consisting of 2-(2 aminoethoxyl)ethanol, 1-amino-2-propanol, diethanolamine, 2-methylaminoethanol, N-methylethanolamine and triethylamino ethanol.

\* \* \* \* \*